US010715026B2

(12) United States Patent
Hirose

(10) Patent No.: US 10,715,026 B2
(45) Date of Patent: Jul. 14, 2020

(54) GATE DRIVING CIRCUIT AND POWER SUPPLY CIRCUIT

(71) Applicant: FUJITSU LIMITED, Kawasaki-shi, Kanagawa (JP)

(72) Inventor: Tatsuya Hirose, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/372,624

(22) Filed: Apr. 2, 2019

(65) Prior Publication Data
US 2019/0229606 A1    Jul. 25, 2019

Related U.S. Application Data

(63) Continuation of application No. PCT/JP2018/008626, filed on Mar. 6, 2018.

(30) Foreign Application Priority Data

Apr. 7, 2017   (JP) ................................. 2017-076809

(51) Int. Cl.
| | | |
|---|---|---|
| H02M 1/08 | (2006.01) | |
| H03K 17/0812 | (2006.01) | |
| H02M 1/34 | (2007.01) | |
| H02M 3/335 | (2006.01) | |

(Continued)

(52) U.S. Cl.
CPC .............. H02M 1/08 (2013.01); H02M 1/34 (2013.01); H02M 1/36 (2013.01); H02M 3/28 (2013.01);

(Continued)

(58) Field of Classification Search
CPC ............ H02M 1/08; H02M 1/34; H02M 1/36; H02M 3/28; H02M 3/33507;
(Continued)

(56) References Cited

U.S. PATENT DOCUMENTS

| 8,686,761 B2 * | 4/2014 | Ozawa .............. H02M 3/33523 363/21.17 |
| 9,312,787 B2 * | 4/2016 | Jeong et al. ........ Y10T 307/685 307/77 |

(Continued)

FOREIGN PATENT DOCUMENTS

| JP | 10-323030 A | 12/1998 |
| JP | 2000-232347 A | 8/2000 |

(Continued)

OTHER PUBLICATIONS

International Search Report dated May 1, 2018, issued in counterpart International Application No. PCT/JP2018/008626 (2 pages).

(Continued)

*Primary Examiner* — Matthew V Nguyen
(74) *Attorney, Agent, or Firm* — Westerman, Hattori, Daniels & Adrian, LLP

(57) ABSTRACT

A gate driving circuit includes a first transistor, a first control circuit that changes a gate voltage of the first transistor from a low level to a high level, and a second control circuit that changes the gate voltage of the first transistor from the high level to the low level, wherein the first control circuit and the second control circuit are coupled to each other in parallel with respect to a gate of the first transistor.

9 Claims, 9 Drawing Sheets

(51) Int. Cl.
  *H02M 1/36* (2007.01)
  *H02M 3/28* (2006.01)
  *H02M 1/00* (2006.01)
(52) U.S. Cl.
  CPC ... *H02M 3/33507* (2013.01); *H02M 3/33523* (2013.01); *H03K 17/08122* (2013.01); *H02M 2001/0054* (2013.01); *H02M 2001/344* (2013.01); *H02M 2001/348* (2013.01)
(58) Field of Classification Search
  CPC ....... H02M 3/33523; H02M 2001/344; H02M 2001/0054; H02M 2001/348; H03K 17/01822
  See application file for complete search history.

(56) References Cited

U.S. PATENT DOCUMENTS

| | | | |
|---|---|---|---|
| 2015/0222263 A1* | 8/2015 | Nagai et al. | H02M 1/08 327/382 |
| 2015/0311805 A1 | 10/2015 | Yamashita | |
| 2018/0123580 A1* | 5/2018 | Kim et al. | H02M 2001/0009 |
| 2018/0248543 A1 | 8/2018 | Senda | |
| 2018/0331613 A1* | 11/2018 | Kondo | H03K 17/567 |

FOREIGN PATENT DOCUMENTS

| | | |
|---|---|---|
| JP | 2003-189592 A | 7/2003 |
| JP | 2012-221991 A | 11/2012 |
| JP | 2016-149920 A | 8/2016 |
| JP | 2017-70051 A | 4/2017 |

OTHER PUBLICATIONS

Written Opinion of the International Searching Authority (Form PCT/ISA/237) dated May 1, 2018, issued in counterpart International Application No. PCT/JP2018/008626, with Partial Translation. (16 pages).

* cited by examiner

GATE DRIVING CIRCUIT AND POWER SUPPLY CIRCUIT

CROSS-REFERENCE TO RELATED APPLICATION

This application is a continuation application of International Application PCT/JP2018/008626 filed on Mar. 6, 2018 and designated the U.S., the entire contents of which are incorporated herein by reference. The International Application PCT/JP2018/008626 is based upon and claims the benefit of priority of the prior Japanese Patent Application No. 2017-076809, filed on Apr. 7, 2017, the entire contents of which are incorporated herein by reference.

FIELD

The embodiments discussed herein are related to a gate driving circuit and a power supply circuit.

BACKGROUND

A power supply circuit that includes a transformer, a switching transistor, and a power supply controller is known. A primary coil of the transformer has a terminal to which a rectified and smoothed input alternating voltage of an alternating-current power supply is supplied. The terminal of the primary coil is connected to a power supply terminal. The switching transistor has a drain terminal connected to another terminal of the primary coil. The switching transistor has a source terminal connected to a ground-side power supply terminal via a first resistor for current value detection. The power supply controller is connected to a gate terminal of the switching transistor and turns on and off the switching transistor based on a predetermined oscillation frequency. A voltage of an output unit that has been input to a first feedback unit is input to the power supply controller. A voltage generated across the first resistor for the current value detection is input to the power supply controller. The power supply controller controls, based on the voltages input to the power supply controller, the ratio of a time period during which the switching transistor is turned on to a time period during which the switching transistor is turned off. By controlling the ratio, the power supply controller controls a current that flows in the switching transistor. The power supply controller switches an operational state of the switching transistor between a clock operation and a constant-current operation.

An initial activation circuit for a power supply device, which includes a rectifying unit, a switching unit, a transforming unit, an activating unit, a driving unit, an output unit, and a controller, is known. The rectifying unit rectifies an input voltage. The rectified voltage output from the rectifying unit is applied to the switching unit, whereby the switch unit is switched. The transforming unit induces the voltage used for the switching of the switching unit from a main winding to an auxiliary winding and a secondary winding. The activating unit is installed between the switching unit and the transforming unit and activates the switching unit by a distributing unit for distributing a voltage applied via the main winding of the transforming unit. The driving unit controls the switching unit by receiving a voltage from the auxiliary winding of the transforming unit. The output unit rectifies a voltage output from the secondary winding of the transforming unit to generate a smoothed output voltage and senses the output voltage. The controller receives a signal sensed by the output unit and switches the switching unit. This reduces power to be consumed by the initial activation circuit for the power supply device and enables the initial activation circuit to stably operate against an overvoltage and an overcurrent.

The followings are reference documents.
[Document 1] Japanese Laid-open Patent Publication No. 2012-221991 and
[Document 2] Japanese Laid-open Patent Publication No. 10-323030.

SUMMARY

According to an aspect of the embodiments, a gate driving circuit includes a first transistor, a first control circuit that changes a gate voltage of the first transistor from a low level to a high level, and a second control circuit that changes the gate voltage of the first transistor from the high level to the low level, wherein the first control circuit and the second control circuit are coupled to each other in parallel with respect to a gate of the first transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1:
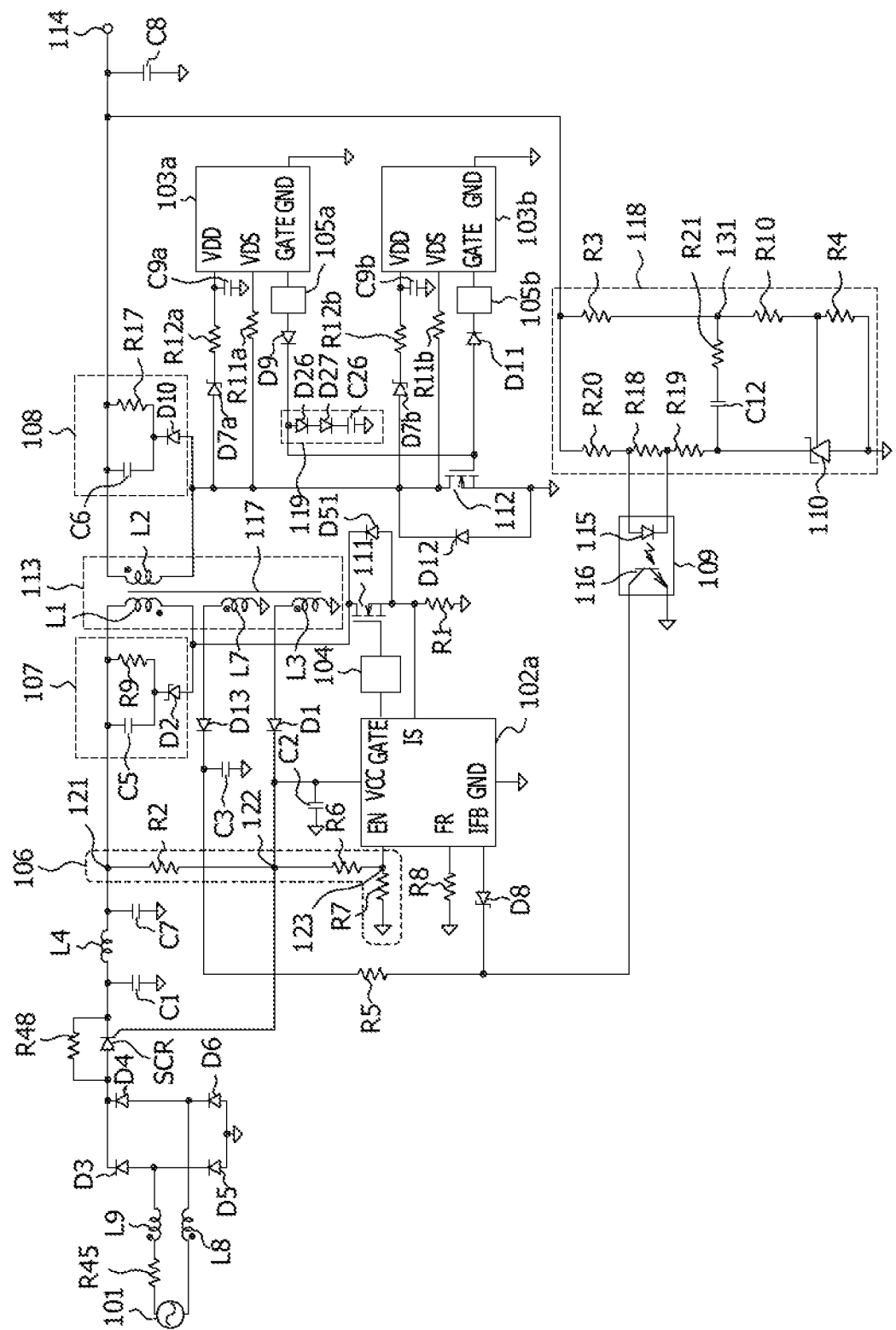
FIG. 1 is a diagram illustrating an example of a configuration of a power supply circuit according to a first embodiment.
Figure 9:
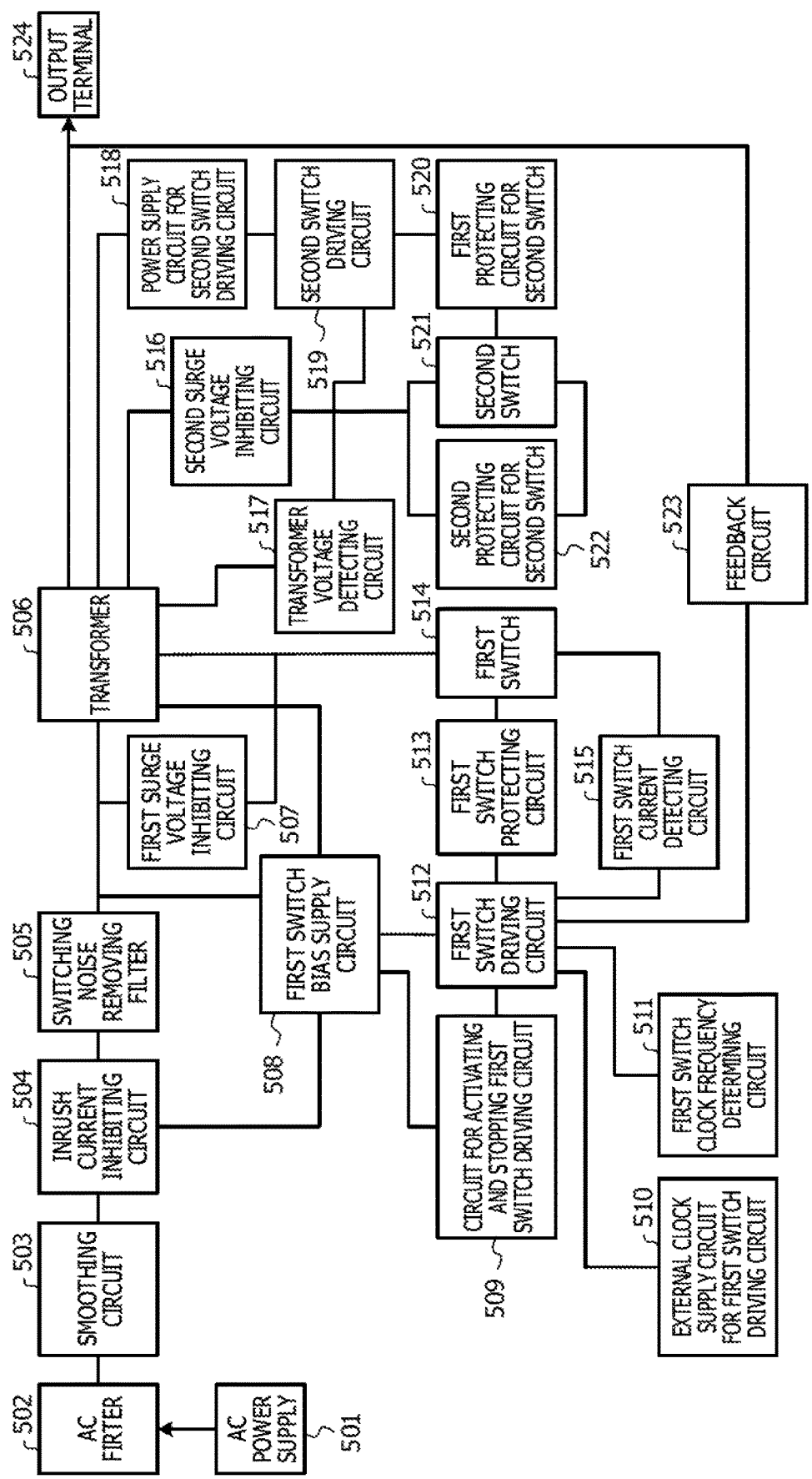
FIG. 9 is a diagram illustrating an example of a functional configuration of the power supply circuit according to the first embodiment.

FIG. 1 is a diagram illustrating an example of a configuration of a power supply circuit according to a first embodiment. FIG. 9 is a diagram illustrating an example of a functional configuration of the power supply circuit according to the first embodiment. The power supply circuit according to the first embodiment is a fly-back alternating current (AC) to direct current (DC) switching power supply circuit. For example, the power supply circuit converts an alternating-current voltage of 100 V to a direct current voltage of 5 V. An alternating-current power supply 101 corresponds to an alternating-current power supply 501 illustrated in FIG. 9 and is a commercial power supply such as a household wall socket. For example, the alternating-current power supply 101 supplies an alternating-current voltage of 100 V or 240 V. The frequency of the alternating-current voltage is, for example, 50 Hz or 60 Hz. A series-connected circuit having a resistor R45 and an inductor L9 connected to the resistor R45 in series is connected between a first terminal of the alternating-current power supply 101 and an anode of a diode D3. An inductor L8 is connected between a second terminal of the alternating-current power supply 101 and an anode of a diode D4. The resistor R45 and the inductors L8 and L9 correspond to an alternating-current filter 502 illustrated in FIG. 9 and are a filter circuit for removing noise and a waveform shaping circuit for removing a harmonic component. The resistor R45 is also a fuse circuit that is disconnected when a large current flows.

An anode of a diode D5 is connected to a reference potential node, while a cathode of the diode D5 is connected to the anode of the diode D3. The reference potential node is, for example, a ground potential node. A cathode of the diode D3 is connected to an anode of a thyristor SCR. An anode of a diode D6 is connected to the reference potential node, while a cathode of the diode D6 is connected to the anode of the diode D4. A cathode of the diode D4 is connected to the anode of the thyristor SCR. The diodes D3 to D6 are a full-wave rectifier circuit and conduct full-wave rectification on the alternating-current voltage and output the voltage subjected to the full-wave rectification to the anode of the thyristor SCR. The diodes D3 to D6 correspond to a smoothing circuit 503 illustrated in FIG. 9.

A resistor R48 is connected between the anode of the thyristor SCR and a cathode of the thyristor SCR. A gate of the thyristor SCR is connected to a node 122. The thyristor SCR is turned on and off based on a voltage of the node 122. When the power supply circuit is activated, the alternating-current power supply 101 starts to supply the alternating-current voltage and the thyristor SCR is in an OFF state. In this case, a current does not flow in the thyristor SCR and flows through the resistor R48, and electric charges are gradually accumulated in capacitors C1 and C7. This may inhibit an inrush current upon the activation of the power supply circuit. The resistor R48 and the thyristor SCR correspond to an inrush current inhibiting circuit 504 illustrated in FIG. 9.

The capacitor C1 is connected between the cathode of the thyristor SCR and the reference potential node. An inductor L4 is connected to the cathode of the thyristor SCR and a node 121. The capacitor C7 is connected between the node 121 and the reference potential node. The capacitors C1 and C7 and the inductor L4 correspond to a switching noise removing filter 505 illustrated in FIG. 9 and remove switching noise.

A voltage dividing circuit 106 corresponds to a circuit 509, illustrated in FIG. 9, for activating and stopping a first switch driving circuit and includes resistors R2, R6, and R7. The resistor R2 is connected between the node 121 and the node 122. The resistor R6 is connected between the node 122 and a node 123. The resistor R7 is connected between the node 123 and the reference potential node. Voltages obtained by dividing a voltage of the node 121 by the voltage dividing circuit 106 are output from the nodes 122 and 123.

When electric charges are accumulated in the capacitors C1 and C7, the voltage of the node 122 increases and the thyristor SCR is turned on. After the activation of the power supply circuit, the thyristor SCR is turned on and a current flows in the thyristor SCR having low on-resistance.

Figure 2:
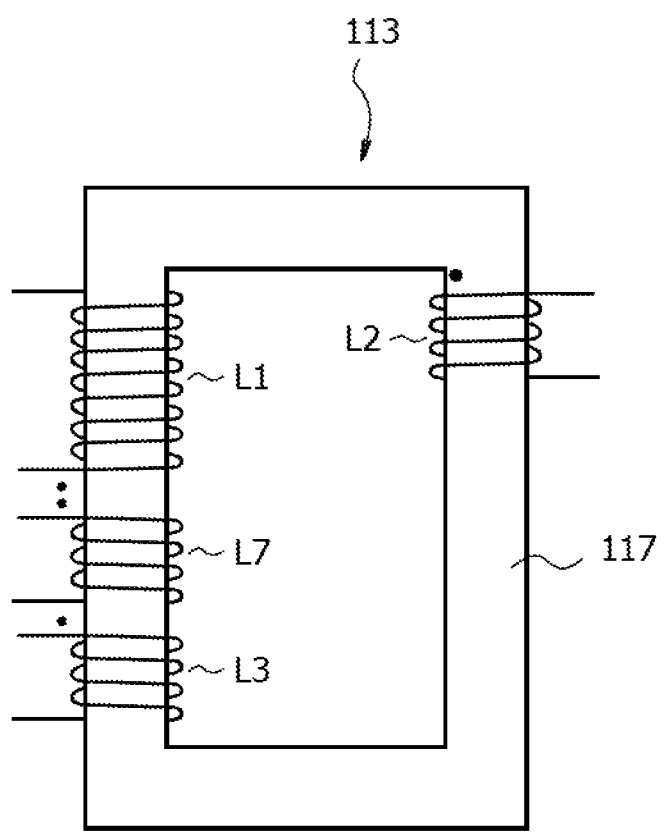
FIG. 2 is a diagram illustrating an example of a configuration of a transformer.

A transformer 113 corresponds to a transformer 506 illustrated in FIG. 9 and includes a primary winding L1, a secondary winding L2, a secondary winding (auxiliary winding) L3, a secondary winding (auxiliary winding) L7, and a core 117. As illustrated in FIG. 2, in the transformer 113, the primary winding L1, the secondary winding L2, the secondary winding L3, and the secondary winding L7 are wound on the core 117. Black points illustrated for the primary winding L1, the secondary winding L2, the secondary winding L3, and the secondary winding L7 indicate winding start points of the primary and secondary windings. The winding start point of the primary winding L1 is on the lower side of the primary winding L1, while the winding start points of the secondary windings L2, L3, and L7 are on the upper sides of the secondary windings L2, L3, and L7. For example, the number of turns of the primary winding L1 is 100, the number of turns of the secondary winding L2 is 10, and the number of turns of each of the secondary windings L3 and L7 is 7.

The primary winding L1 is connected between the node 121 and a drain of a transistor 111. The transistor 111 corresponds to a first switch 514 illustrated in FIG. 9 and is, for example, a gallium nitride (GaN) high electron mobility transistor (HEMT). The HEMT has advantages of resistance to a high voltage and high-speed switching. An anode of a diode D51 is connected to a source of the transistor 111, while a cathode of the diode D51 is connected to the drain of the transistor 111. A resistor R1 corresponds to a first switch current detecting circuit 515 illustrated in FIG. 9 and is connected between the source of the transistor 111 and the reference potential node. The secondary winding L3 is connected between an anode of a diode D1 and the reference potential node. A cathode of the diode D1 is connected to the node 122. The diode D1 is connected to the secondary winding L3 in series. A capacitor C2 is connected between the node 122 and the reference potential node. The node 122 is connected to a power supply terminal VCC of a primary control integrated circuit (IC) 102a.

The secondary winding L7 is connected between an anode of a diode D13 and the reference potential node. A capacitor C3 is connected between a cathode of the diode D13 and the reference potential node. A resistor R5 is connected between the cathode of the diode D13 and a collector of a phototransistor 116.

Next, operations of the fly-back transformer 113 are described. The primary control IC 102a is a driving circuit and corresponds to the first switch driving circuit 512 illustrated in FIG. 9 and outputs a pulse with a frequency higher than a frequency (50 Hz or 60 Hz) of the alternating-current power supply 101 to the gate of the transistor 111 via a waveform shaping and protecting circuit 104. Then, the transistor 111 is alternately repeatedly turned on and off. When the transistor 111 is turned on, a current flows in the primary winding L1, a magnetic flux is generated, the core 117 is magnetized, and energy is accumulated in the core 117. When the transistor 111 is turned off, energy accumulated in the core 117 is released and the secondary windings L2, L3, and L7 output power.

The secondary winding L2 is connected between an output terminal 114 and a cathode of a diode D12. An anode of the diode D12 is connected to the reference potential node. The diode D12 corresponds to a second protecting circuit 522, illustrated in FIG. 9, for a second switch. The output terminal 114 corresponds to an output terminal 524 illustrated in FIG. 9. A capacitor C8 is connected between the output terminal 114 and the reference potential node. A pulse voltage is generated across the secondary winding L2, the capacitor C8 smooths the pulse voltage, and a direct-current voltage is applied to the output terminal 114. Similarly, a pulse voltage is generated across the secondary winding L3, the capacitor C2 smooths the pulse voltage, and a direct-current voltage is applied to the node 122. Similarly, a pulse voltage is generated across the secondary winding L7, the capacitor C3 smooths the pulse voltage, and a direct-current voltage is applied to the collector of the phototransistor 116.

For example, when the alternating-current voltage of the alternating-current power supply 101 is 100V, a voltage of the node 121 is approximately 141V, a pulse voltage in a range of 30V to 40V is generated across the secondary winding L2, and pulse voltages in a range of 8V to 11V are generated across the secondary windings L3 and L7. A target voltage of the output terminal 114 is a direct-current voltage of 5 V.

To reduce a loss caused by a voltage drop of the diode D12, a transistor 112 is mounted. The transistor 112 is, for example, a gallium nitride (GaN) HEMT. A drain of the transistor 112 is connected to the cathode of the diode D12, while a source of the transistor 112 is connected to the anode of the diode D12. Thus, the transistor 112 is connected to the diode D12 in parallel. The transistor 112 corresponds to the second switch 521 illustrated in FIG. 9.

A circuit for a secondary control IC 103a is described. An anode of a Zener diode D7a is connected to the drain of the transistor 112. A resistor R12a is connected between a cathode of the Zener diode D7a and a power supply terminal VDD of the secondary control IC 103a. A capacitor C9a is connected between the power supply terminal VDD of the secondary control IC 103a and the reference potential node. A ground terminal GND of the secondary control IC 103a is connected to the reference potential node. Thus, a power supply voltage is applied to the power supply terminal VDD of the secondary control IC 103a. The Zener diode D7a, the resistor R12a, and the capacitor C9a correspond to a power supply circuit 518, illustrated in FIG. 9, for a second switch driving circuit.

A resistor R11a corresponds to a transformer voltage detecting circuit 517 illustrated in FIG. 9 and is connected between the drain of the transistor 112 and a detection terminal VDS of the secondary control IC 103a. The secondary control IC 103a corresponds to the second switch driving circuit 519 illustrated in FIG. 9. When a voltage corresponding to a current flowing in the detection terminal VDS is higher than a threshold, the secondary control IC 103a outputs a high-level voltage from an output terminal GATE of the secondary control IC 103a. When the voltage corresponding to the current flowing in the detection terminal VDS is lower than the threshold, the secondary control IC 103a outputs a low-level voltage from the output terminal GATE. For example, when a drain voltage of the transistor 112 is higher than the threshold, the secondary control IC 103a outputs the high-level voltage from the output terminal GATE. When a drain current of the transistor 112 is 0, the secondary control IC 103a outputs the low-level voltage from the output terminal GATE. The output terminal GATE of the secondary control IC 103a outputs a pulse voltage to a gate of the transistor 112 via a waveform shaping circuit 105a, a diode D9, and a protecting circuit 119. The waveform shaping circuit 105a, the diode D9, and the protecting circuit 119 correspond to a first protecting circuit 520, illustrated in FIG. 9, for the second switch.

The waveform shaping circuit 105a is connected between the output terminal GATE of the secondary control IC 103a and an anode of the diode D9. A cathode of the diode D9 is connected to the gate of the transistor 112. The protecting circuit 119 is connected to the cathode of the diode D9. The protecting circuit 119 includes diodes D26 and D27 and a capacitor C26. An anode of the diode D26 is connected to the gate of the transistor 112, while a cathode of the diode D26 is connected to an anode of the diode D27. The capacitor C26 is connected between a cathode of the diode D27 and the reference potential node.

Figure 5:
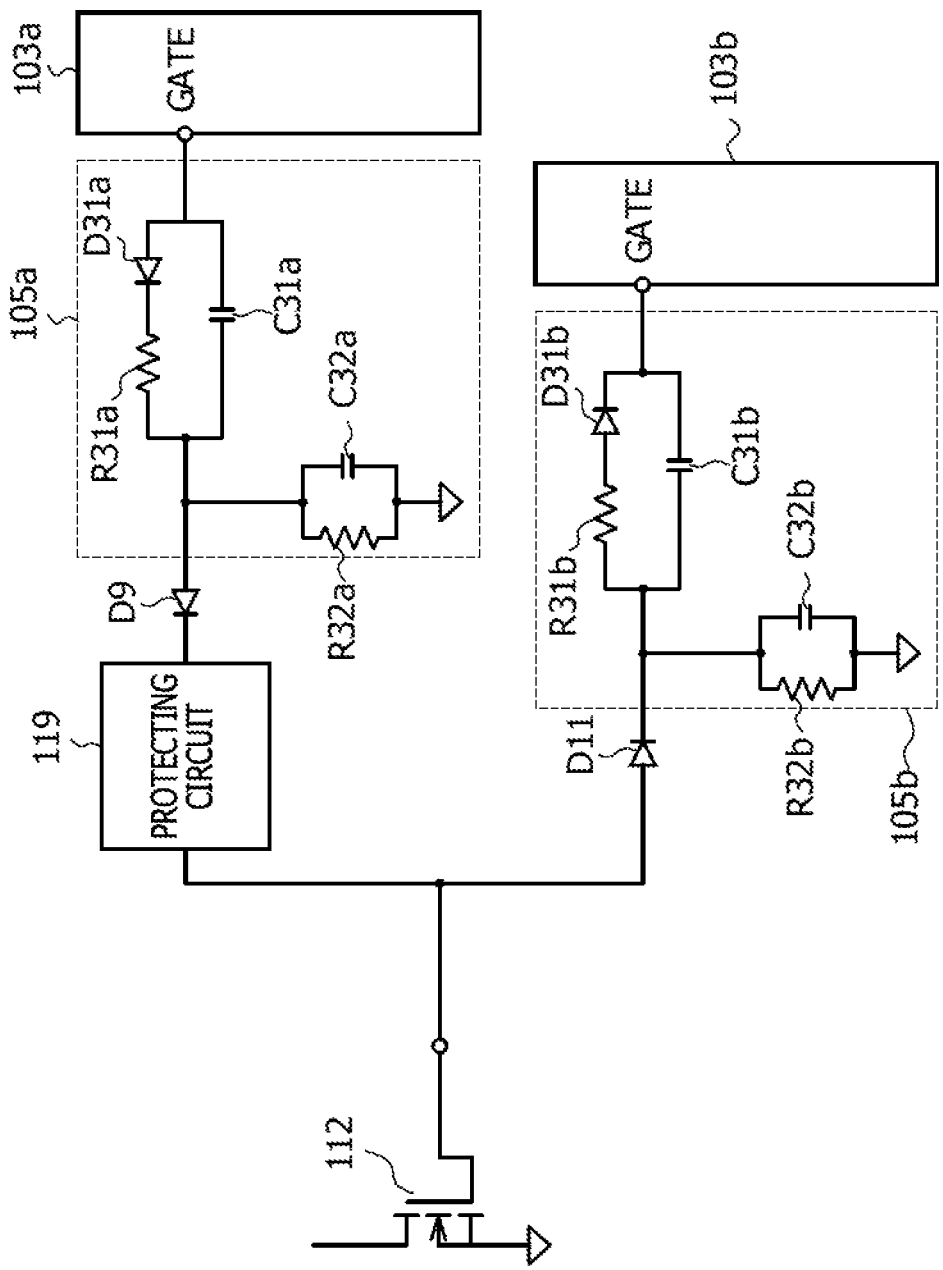
FIG. 5 is a diagram illustrating an example of a configuration of a waveform shaping circuit.

As illustrated in FIG. 5, the waveform shaping circuit 105a includes a diode D31a, resistors R31a and R32a, and capacitors C31a and C32a. An anode of the diode D31a is connected to the output terminal GATE of the secondary control IC 103a. The resistor R31a is connected between a cathode of the diode D31a and the anode of the diode D9. The capacitor C31a is connected between the output terminal GATE of the secondary control IC 103a and the anode of the diode D9. The capacitor C32a is connected between the anode of the diode D9 and the reference potential node. The resistor R32a is connected to the capacitor C32a in parallel.

Figure 4:
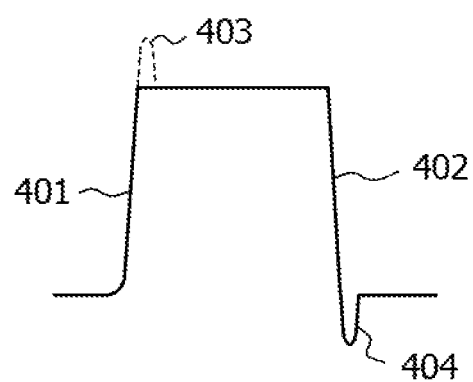
FIG. 4 is a diagram illustrating a gate voltage.

A current flows from the output terminal GATE of the secondary control IC 103a through the diode D9 to the gate of the transistor 112. For example, the current flows through the diode D9 upon the rising of a gate voltage of the transistor 112 and does not flow through the diode D9 upon the falling of the gate voltage of the transistor 112. As a result, the secondary control IC 103a has a function of changing the gate voltage of the transistor 112 from a low level to a high level. The waveform shaping circuit 105a shapes a rising edge of the gate voltage output by the secondary control IC 103a so that the rising edge of the gate voltage is steep in order to quickly turn on the transistor 112. For example, as illustrated in FIG. 4, the waveform shaping circuit 105a shapes a rising edge 401 of the gate voltage of the transistor 112 so that the rising edge 401 of the gate voltage of the transistor 112 is steep. The protecting circuit 119 suppresses overshoot 403 of the gate voltage output by the secondary control IC 103a in order to protect the transistor 112, as illustrated in FIG. 4.

Next, a circuit for a secondary control IC 103b is described. An anode of a Zener diode D7b is connected to the drain of the transistor 112. A resistor R12b is connected between a cathode of the Zener diode D7b and a power supply terminal VDD of the secondary control IC 103b. A capacitor C9b is connected between the power supply terminal VDD of the secondary control IC 103b and the reference potential node. A ground terminal GND of the secondary control IC 103b is connected to the reference potential node. Thus, a power supply voltage is applied to the power supply terminal VDD of the secondary control IC 103b. The Zener diode D7b, the resistor R12b, and the capacitor C9b correspond to the power supply circuit 518, illustrated in FIG. 9, for the second switch driving circuit.

A resistor R11b corresponds to the transformer voltage detecting circuit 517 illustrated in FIG. 9 and is connected between the drain of the transistor 112 and a detection terminal VDS of the secondary control IC 103b. The secondary control IC 103b corresponds to the second switch driving circuit 519 illustrated in FIG. 9. When a voltage corresponding to a current flowing in the detection terminal VDS is higher than a threshold, the secondary control IC 103b outputs a high-level voltage from an output terminal GATE of the secondary control IC 103b. When the voltage corresponding to the current flowing in the detection terminal VDS is lower than the threshold, the secondary control IC 103b outputs a low-level voltage from the output terminal GATE. For example, when the drain voltage of the transistor 112 is higher than the threshold, the secondary control IC 103b outputs the high-level voltage from the output terminal GATE. When the drain current of the transistor 112 is 0, the secondary control IC 103b outputs the low-level voltage from the output terminal GATE. The output terminal GATE of the secondary control IC 103b outputs a pulse voltage to the gate of the transistor 112 via the waveform shaping circuit 105b and a diode D11. The waveform shaping circuit 105b and the diode D11 correspond to the first protecting circuit 520, illustrated in FIG. 9, for the second switch.

The waveform shaping circuit 105b is connected between the output terminal GATE of the secondary control IC 103b and a cathode of the diode D11. An anode of the diode D11 is connected to the gate of the transistor 112.

The waveform shaping circuit 105b includes a diode D31b, resistors R31b and R32b, and capacitors C31b and C32b. A cathode of the diode D31b is connected to the output terminal GATE of the secondary control IC 103b. The resistor R31b is connected between an anode of the diode D31b and the cathode of the diode D11. The capacitor C31b is connected between the output terminal GATE of the secondary control IC 103b and the cathode of the diode D11. The capacitor C32b is connected between the cathode of the diode D11 and the reference potential node. The resistor R32b is connected to the capacitor C32b in parallel.

A current flows from the gate of the transistor 112 through the diode D11 to the output terminal GATE of the secondary control IC 103b. For example, the current does not flow through the diode D11 upon the rising of the gate voltage of the transistor 112 and flows through the diode D11 upon the falling of the gate voltage of the transistor 112. As a result, the secondary control IC 103b has a function of changing the gate voltage of the transistor 112 from the high level to the low level. The waveform shaping circuit 105b shapes a falling edge of the gate voltage output by the secondary control IC 103b so that the falling edge of the gate voltage is steep in order to quickly turn off the transistor 112. For example, as illustrated in FIG. 4, the waveform shaping circuit 105b shapes a falling edge 402 of the gate voltage of the transistor 112 so that the falling edge 402 of the gate voltage is steep.

The protecting circuit 119 for suppressing overshoot 403 (illustrated in FIG. 4) upon the rising of the gate voltage of the transistor 112 is mounted for the secondary control IC 103a. A protecting circuit for suppressing undershoot 404 (illustrated in FIG. 4) upon the falling of the gate voltage of the transistor 112 is not mounted for the secondary control IC 103b. As a result, the overshoot 403 of the gate voltage of the transistor 112 is suppressed, and the undershoot 404 of the gate voltage of the transistor 112 is not suppressed. It is preferable that the protecting circuit 119 suppress the overshoot 403 in order to protect the transistor 112. When the transistor 112 is an HEMT, a threshold voltage of the transistor 112 is low and it is preferable that the undershoot 404 not be suppressed in order to reliably turn off the transistor 112.

The waveform shaping circuit 105a for shaping the rising edge 401 (illustrated in FIG. 4) of the gate voltage of the transistor 112 is mounted for the secondary control IC 103a. The waveform shaping circuit 105b for shaping the falling edge 402 of the gate voltage of the transistor 112 is mounted for the secondary control IC 103b. Since the shape of the rising edge 401 is different from the shape of the falling edge 402, circuit constants of the waveform shaping circuits 105a and 105b are different from each other. The reason is described below.

When the transistor 112 is in an ON state, a voltage between the drain and source of the transistor 112 is low and a gate capacity is small. When the transistor 112 is in an OFF state, the voltage between the drain and source of the transistor 112 is high and the gate capacity is large. Since the gate capacity in the ON state of the transistor 112 is different from the gate capacity in the OFF state of the transistor 112, the shapes of the rising and falling edges 401 of the gate voltage of the transistor 112 are different from each other due to a parasitic inductor. Since the gate capacity in the ON state of the transistor 112 is different from the gate capacity in the OFF state of the transistor 112, ringing caused by resonance upon the rising edge 401 is different from ringing caused by resonance upon the falling edge 402. As a result, the shapes of the rising and falling edges 401 and 402 are different from each other. Thus, the circuit constant of the waveform shaping circuit 105a for shaping the rising edge 401 is different from the circuit constant of the waveform shaping circuit 105b for shaping the falling edge 402. The waveform shaping circuit 105a conducts waveform shaping suitable for the rising edge 401. The waveform shaping circuit 105b conducts waveform shaping suitable for the falling edge 401.

The secondary control ICs 103a and 103b are connected to each other in parallel with respect to the gate of the transistor 112. The secondary control ICs 103a and 103b are synchronized with the drain voltage of the transistor 112 based on the detection terminal VDS to generate the gate voltage. Thus, the gate voltage generated by the secondary control IC 103a is synchronized with the gate voltage generated by the secondary control IC 103b.

The example in which the gate voltages are generated using the two secondary control ICs 103a and 103b is described above. The case where a gate voltage is generated using a single secondary control IC is described below. In this case, diodes D9 and D11, a waveform shaping circuit 105a, and a protecting circuit 119 are mounted between the single secondary control IC and a gate of a transistor 112. The secondary control IC generates a rising edge 401 of a gate voltage and a falling edge 402 of the gate voltage. There is a problem that the protecting circuit 119 may suppress not only overshoot 403 of the gate voltage but also undershoot 404 of the gate voltage. Since the waveform shaping circuit 105a uses the same circuit constant to shape the rising and falling edges 401 and 402 of the gate voltage, there is a problem that an inclination of the rising edge 401 is different from an inclination of the falling edge 402.

According to the first embodiment, since the two secondary control ICs 103a and 103b are mounted, the overshoot 403 may be suppressed and the undershoot 404 may remain. The waveform shaping circuit 105a conducts the waveform shaping suitable for the rising edge 401, while the waveform shaping circuit 105b conducts the waveform shaping suitable for the falling edge 402.

Figure 6:
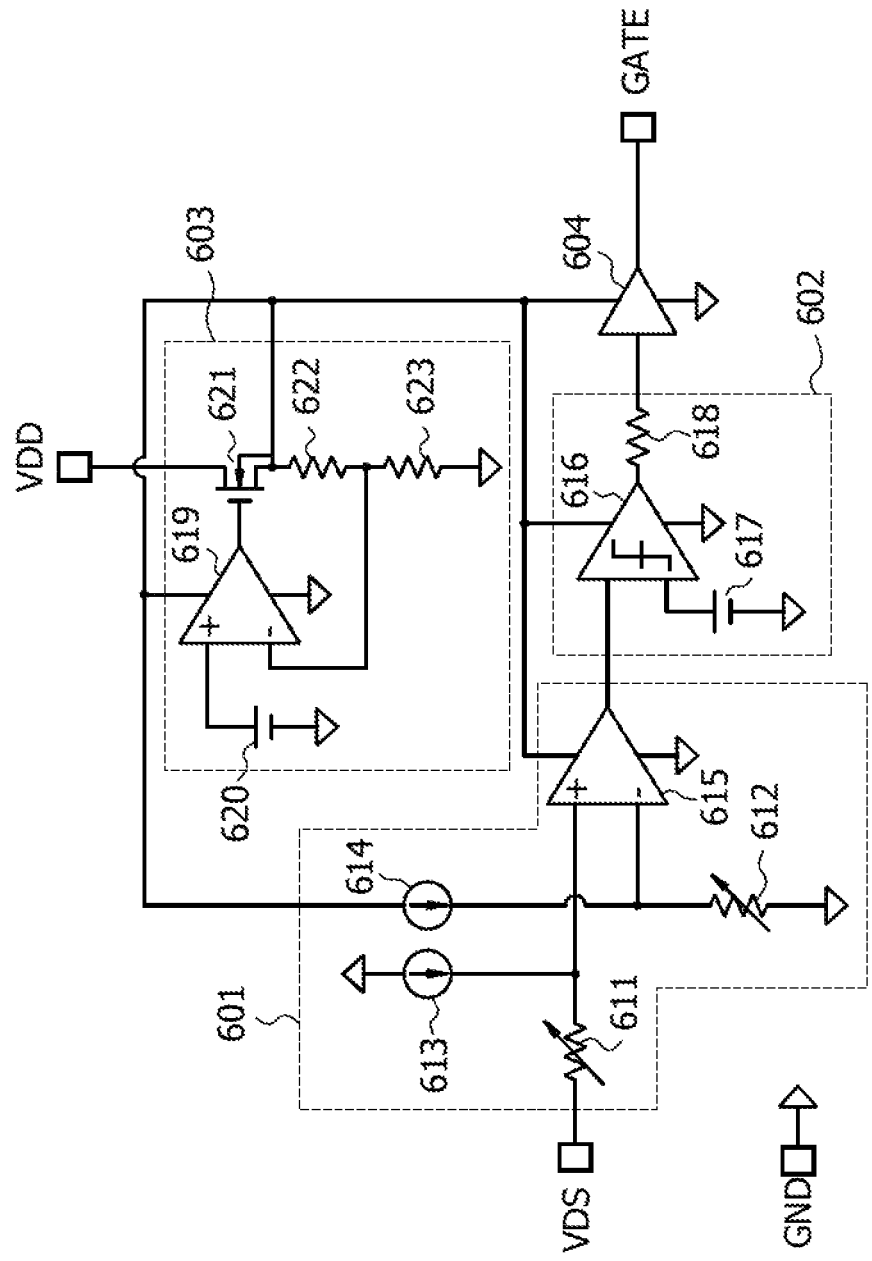
FIG. 6 is a diagram illustrating an example of a configuration of a secondary control IC.
Figure 7:
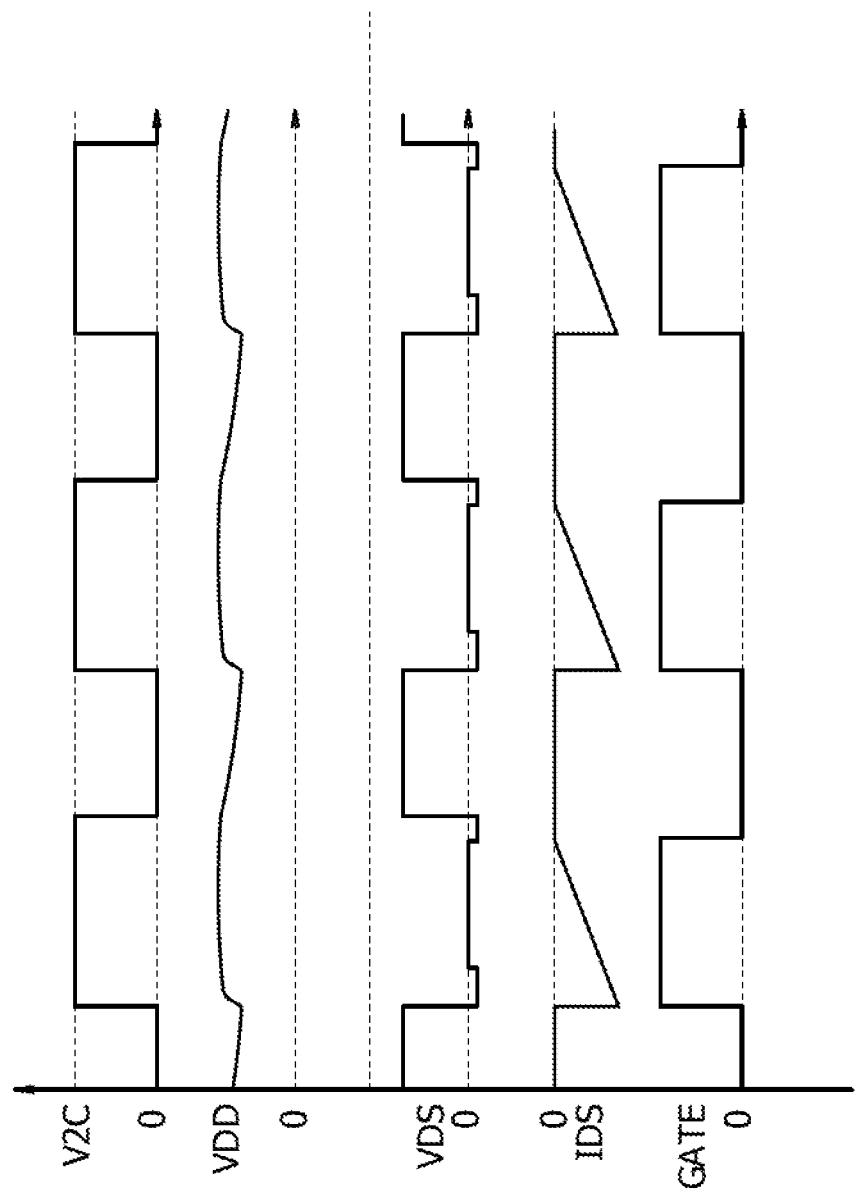
FIG. 7 is a waveform diagram describing operations of the secondary control IC.

FIG. 6 is a diagram illustrating an example of a configuration of the secondary control IC 103a. FIG. 7 is a waveform diagram describing operations of the secondary control IC 103a. The secondary control IC 103b has the same configuration as the secondary control IC 103a. The configuration of the secondary control IC 103a is described below as an example. The secondary control IC 103a includes a current detector 601, a comparator 602, an internal power generator 603, and an amplifier 604.

A voltage V2C indicates the drain voltage of the transistor 112. The Zener diode D7a, the resistor R12a, and the capacitor C9a, which are illustrated in FIG. 1, smooth the voltage V2C and output a direct-current voltage including a ripple voltage to the power supply terminal VDD of the secondary control IC 103a. The internal power generator 603 includes a differential amplifier 619, a direct-current power supply 620, a transistor 621, and resistors 622 and 623 and generates an internal power supply voltage based on the direct-current voltage of the power supply terminal VDD.

The current detector 601 includes variable resistors 611 and 612, a differential amplifier 615, and current sources 613 and 614. The differential amplifier 615 amplifies a voltage corresponding to a current flowing in the detection terminal VDS.

The comparator 602 includes a comparator 616, a direct-current power supply 617, and a resistor 618. When an output voltage of the differential amplifier 615 is higher than a reference voltage of the direct-current power supply 617, the comparator 616 outputs a high-level voltage. When the output voltage of the differential amplifier 615 is lower than the reference voltage of the direct-current power supply 617, the comparator 616 outputs a low-level voltage. The amplifier 604 amplifies an output voltage of the comparator 602 and outputs the amplified voltage to the output terminal GATE.

A current IDS illustrated in FIG. 7 flows from the drain of the transistor 112 to the source of the transistor 112. When the voltage of the output terminal GATE is changed from the low level to the high level, the transistor 112 is turned on, the current IDS flows and is attenuated over time. When the current IDS is 0, a voltage of a non-inverting input terminal of the differential amplifier 615 is 0 and the voltage of the output terminal GATE is at the low level.

As described above, when the drain voltage V2C of the transistor 112 is higher than the threshold, the secondary control IC 103a outputs the high-level voltage from the output terminal GATE. When the drain current IDS of the transistor 112 is 0, the secondary control IC 103a outputs the low-level voltage from the output terminal GATE.

In FIG. 1, when the gate voltage of the transistor 112 reaches the high level, the transistor 112 is turned on. When the gate voltage of the transistor 112 reaches the low level, the transistor 112 is turned off. Thus, by turning on the transistor 112, a loss caused by the diode D12 may be reduced.

When the transistor 112 is an HEMT, a switching speed of the transistor 112 is high, dV/dt is large, and a spike voltage generated due to parasitic inductance caused by leakage inductance caused by flux leakage of the transformer 113 and a board wiring is large. A snubber circuit 108 is connected between the output terminal 114 and the drain of the transistor 112. The snubber circuit 108 is a protecting circuit for suppressing a spike voltage (of 400 V to 1 kV) upon the switching of the transistor 112. The snubber circuit 108 corresponds to a second surge voltage inhibiting circuit 516 illustrated in FIG. 9 and includes a capacitor C6, a resistor R17, and a diode D10. The capacitor C6 is connected between the output terminal 114 and a cathode of the diode D10. The resistor R17 is connected to the capacitor C6 in parallel. An anode of the diode D10 is connected to the drain of the transistor 112. The capacitor C6 is charged to absorb the spike voltage (high voltage) upon the switching of the transistor 112. When the transistor 112 is in the OFF state, the capacitor C6 releases electric charges to the resistor R17.

A bias circuit 118 is connected between the output terminal 114 and a photocoupler 109. The photocoupler 109 includes a light emitting diode 115 and the phototransistor 116. An emitter of the phototransistor 116 is connected to the reference potential node. The resistor R5 is connected between the cathode of the diode D13 and the collector of the phototransistor 116. The bias circuit 118 and the photocoupler 109 correspond to a feedback circuit 523 illustrated in FIG. 9.

Next, a configuration of the bias circuit 118 is described. A Zener diode 110 is a voltage reference circuit. An anode of the Zener diode 110 is connected to the reference potential node. A resistor R3 is connected between the output terminal 114 and a node 131. A resistor R10 is connected between the node 131 and a reference terminal of the Zener diode 110. A resistor R4 is connected between the reference terminal of the Zener diode 110 and the reference potential node. A resistor R20 is connected between the output terminal 114 and an anode of the light emitting diode 115. A resistor R18 is connected between the anode of the light emitting diode 115 and a cathode of the light emitting diode 115. A resistor R19 is connected between the cathode of the light emitting diode 115 and a cathode of the Zener diode 110. A series-connected circuit having a capacitor C12 and a resistor R21 connected to the capacitor C12 in series is connected between the cathode of the Zener diode 110 and the node 131.

When a voltage of the output terminal 114 increases, the intensity of light emitted by the light emitting diode 115 increases and a current flowing in the phototransistor 116 increases. In this case, the primary control IC 102a reduces a duty ratio of a gate pulse of the transistor 111. The duty ratio of the gate pulse is the ratio of a time period during which the gate pulse is at a high level within a period of the gate pulse to the period of the gate pulse. For example, when the voltage of the output terminal 114 is higher than the target voltage of 5 V, the primary control IC 102a reduces the duty ratio of the gate pulse of the transistor 111. Thus, the voltage of the output terminal 114 decreases.

On the other hand, when the voltage of the output terminal 114 decreases, the intensity of the light emitted by the light emitting diode 115 decreases and the current flowing in the phototransistor 116 decreases. In this case, the primary control IC 102a increases the duty ratio of the gate pulse of the transistor 111. For example, when the voltage of the output terminal 111 is lower than the target voltage of 5 V, the primary control IC 102a increases the duty ratio of the gate pulse of the transistor 111. Thus, the voltage of the output terminal 114 increases. The output terminal 114 is maintained at the fixed target voltage of 5 V.

The power supply terminal VCC of the primary control IC 102a is connected to the node 122. Upon the activation of the power supply circuit, the secondary winding L3 does not output power, a current flows from the node 121 through the resistor R2 to the capacitor C2, and the capacitor C2 is charged. The capacitor C2 supplies a power supply voltage to the power supply terminal VCC of the primary control IC 102a, whereby the primary control IC 102a is operable.

After the activation of the power supply circuit, the secondary winding L3 outputs power, a current flows from the secondary winding L3 through the diode D1 to the capacitor C2, and the capacitor C2 is charged. The capacitor C2 supplies a power supply voltage to the power supply terminal VCC of the primary control IC 102a, whereby the primary control IC 102a is operable. The resistor R2, the secondary winding L3, the diode D1, and the capacitor C2 correspond to a first switch bias supply circuit 508 illustrated in FIG. 9.

An enable terminal EN of the primary control IC 102a is connected to the node 123. A resistor R8 corresponds to a first switch clock frequency determining circuit 511 illustrated in FIG. 9 and is connected between a frequency control terminal FR of the primary control IC 102a and the reference potential node. An anode of a Zener diode D8 is connected to a current feedback terminal IFB of the primary control IC 102a, while a cathode of the Zener diode D8 is connected to the collector of the phototransistor 116. The waveform shaping and protecting circuit 104 corresponds to a first switch protecting circuit 513 illustrated in FIG. 9 and has the same configuration as that of the diodes D9 and D11, the waveform shaping circuit 105a, and the protecting circuit 119. In this case, the diode D11 is connected to the diode D9 in parallel. The waveform shaping and protecting circuit 104 is connected between an output terminal GATE of the primary control IC 102a and the gate of the transistor 111. A current detection terminal IS of the primary control IC 102a is connected to the source of the transistor 111. A ground terminal GND of the primary control IC 102a is connected to the reference potential node. In FIG. 9, an external clock supply circuit 510 for the first switch driving circuit supplies a clock signal to the first switch driving circuit 512.

Figure 3A:
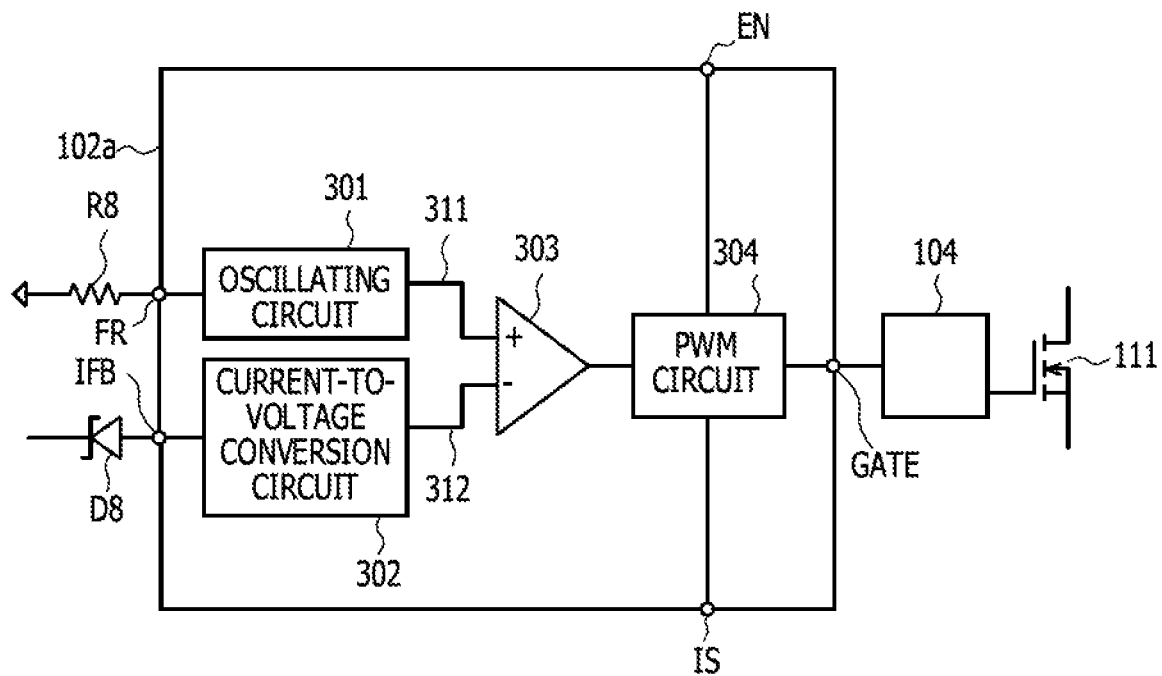
FIG. 3A is a conceptual diagram illustrating an example of a configuration of a primary control IC.
Figure 3B:
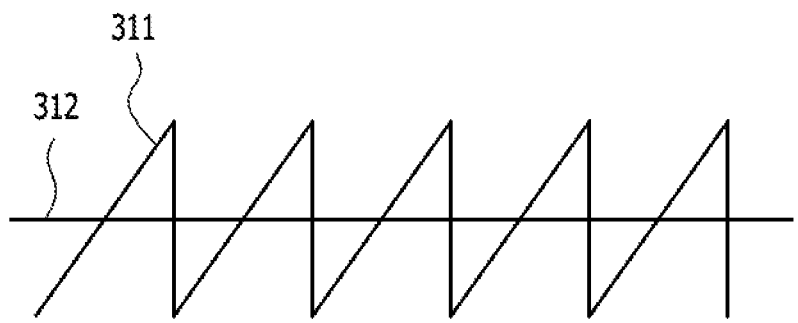
FIG. 3B is a voltage waveform diagram describing operations of the primary control IC.

FIG. 3A is a conceptual diagram illustrating an example of a configuration of the primary control IC 102a. FIG. 3B is a voltage waveform diagram describing operations of the primary control IC 102a. The primary control IC 102a includes an oscillating circuit 301, a current-to-voltage conversion circuit 302, a comparator 303, and a pulse width modulation (PWM) circuit 304. The oscillating circuit 301 is connected to the resistor R8 via the frequency control terminal FR and generates a ramp voltage (sawtooth voltage) 311 with a frequency based on a value of the resistor R8. The resistor R8 is mounted outside the primary control IC 102a. By changing the resistor R8, the frequency of the ramp voltage 311 generated by the oscillating circuit 301 may be changed.

For example, when the transistor 111 is an HEMT, the transistor 111 operates at a high speed and the frequency of the ramp voltage 311 may be increased by the resistor R8. When the transistor 111 is a MOS field-effect transistor, the transistor 111 operates at a low speed and the frequency of the ramp voltage 311 may be reduced by the resistor R8.

The current-to-voltage conversion circuit 302 converts, to a voltage 312, the current flowing in the phototransistor 116 through the Zener diode D8. When the ramp voltage 311 is higher than the voltage 312, the comparator 303 outputs a high-level voltage. When the ramp voltage 311 is lower than the voltage 312, the comparator 303 outputs a low-level voltage. When the voltage of the enable terminal EN is higher than a threshold, the PWM circuit 304 is in an enable state and outputs, from the output terminal GATE, the gate pulse with the duty ratio based on an output pulse of the comparator 303. When the PWM circuit 304 detects an overcurrent of the transistor 111 based on the current detection terminal IS, the PWM circuit 304 stops operating. The output terminal GATE outputs the gate pulse to the gate of the transistor 111 via the waveform shaping and protecting circuit 104. When the gate pulse is at the high level, the transistor 111 is in the ON state. When the gate pulse is at the low level, the transistor 111 is in the OFF state.

A time period during which the output pulse of the comparator 303 is at the low level corresponds to a time period during which the transistor 111 is in the ON state. A time period during which the output pulse of the comparator 303 is at the high level corresponds to a time period during which the transistor 111 is in the OFF state. The PWM circuit 304 sets the frequency of the gate pulse to a fixed value and controls the duty ratio of the gate pulse. For example, as the time period during which the output pulse of the comparator 303 is at the low level is longer, the PWM circuit 304 increases the duty ratio of the gate pulse. As the time period during which the output pulse of the comparator 303 is at the low level is shorter, the PWM circuit 304 reduces the duty ratio of the gate pulse.

As described above, when the voltage of the output terminal 114 is higher than the target voltage of 5 V, the primary control IC 102a reduces the duty ratio of the gate pulse. This reduces the voltage of the output terminal 114. When the voltage of the output terminal 114 is lower than the target voltage of 5 V, the primary control IC 102a increases the duty ratio of the gate pulse of the transistor 111. This increases the voltage of the output terminal 114. Thus, the voltage of the output terminal 114 is the fixed target voltage of 5 V. A load is connected to the output terminal 114. The power supply circuit may supply the direct-current power supply voltage of 5 V to the load.

A primary control IC that does not include a frequency control terminal FR is described below as the primary control IC 102a. Even when an oscillation frequency of an oscillating circuit of the primary control IC is a fixed value (for example, a low frequency of 50 kHz) and the primary control IC drives a MOS field-effect transistor, the primary control IC may not drive an HEMT at a high speed. When a high-speed transistor such as an HEMT is used as the transistor 111, the primary control IC 102a having the frequency control terminal FR is mounted, as described in the first embodiment. Since the resistor R8 is mounted, the primary control IC 102a may generate a high-frequency gate pulse. Thus, the primary control IC 102a may switch the transistor 111 at a high speed.

It is preferable that the transistors 111 and 112 be high-speed transistors such as HEMTs. As maximum oscillation frequencies fmax, causing a power amplification factor to be 1, of the transistors 111 and 112 and cutoff frequencies ft, causing a current amplification factor to be 1, of the transistors 111 and 112 are higher, the transistors 111 and 112 are more preferable. For example, it is preferable that the maximum oscillation frequencies fmax and the cutoff frequencies ft be seventh or higher harmonics (frequency components enabling rectangular waves) of frequencies to be used for the switching of the transistors 111 and 112. It is preferable that the maximum oscillation frequencies fmax, causing the power amplification factor to be 1, of the transistors 111 and 112 and the cutoff frequencies ft, causing the current amplification factor to be 1, of the transistors 111 and 112 be 10 MHz or higher.

Since the resistor R2, the capacitor C2, the diode D1, and the secondary winding L3 are connected to the power supply terminal VCC of the primary control IC 102a, a power supply voltage may be supplied to the power supply voltage VCC of the primary control IC 102a upon and after the activation. When the voltage dividing circuit 106 is connected to the enable terminal EN of the primary control IC 102a, the primary control IC 102a may be in an enable state.

When the transistor 111 is an HEMT, the switching speed of the transistor 111 is high, dV/dt is large, and a spike voltage generated due to parasitic inductance caused by leakage inductance caused by flux leakage of the transformer 113 and the board wiring is large. A snubber circuit 107 is connected between the node 121 and the drain of the transistor 111 and is a protecting circuit for suppressing a spike voltage (of 400 V to 1 kV) upon the switching of the transistor 111. The snubber circuit 107 corresponds to a first surge voltage inhibiting circuit 507 illustrated in FIG. 9 and includes a capacitor C5, a resistor R9, and a Zener diode D2. The capacitor C5 is connected between the node 121 and a cathode of the Zener diode D2. The resistor R9 is connected to the capacitor C5 in parallel. An anode of the Zener diode D2 is connected to the drain of the transistor 111. The capacitor C5 is charged to absorb the spike voltage (high voltage) upon the switching of the transistor 111. When the transistor 111 is in the OFF state, the capacitor C5 releases electric charges to the resistor R9.

According to the first embodiment, since the two secondary control ICs 103a and 103b are mounted, the rising of the gate voltage of the transistor 112 and the falling of the gate voltage of the transistor 112 may be separately controlled. For example, since the two secondary control ICs 103a and 103b are mounted, the overshoot 403 may be suppressed and the undershoot 404 may remain. The waveform shaping circuit 105a conducts the waveform shaping suitable for the rising edge 401, while the waveform shaping circuit 105b conducts the waveform shaping suitable for the falling edge 402.

Second Embodiment

Figure 8:
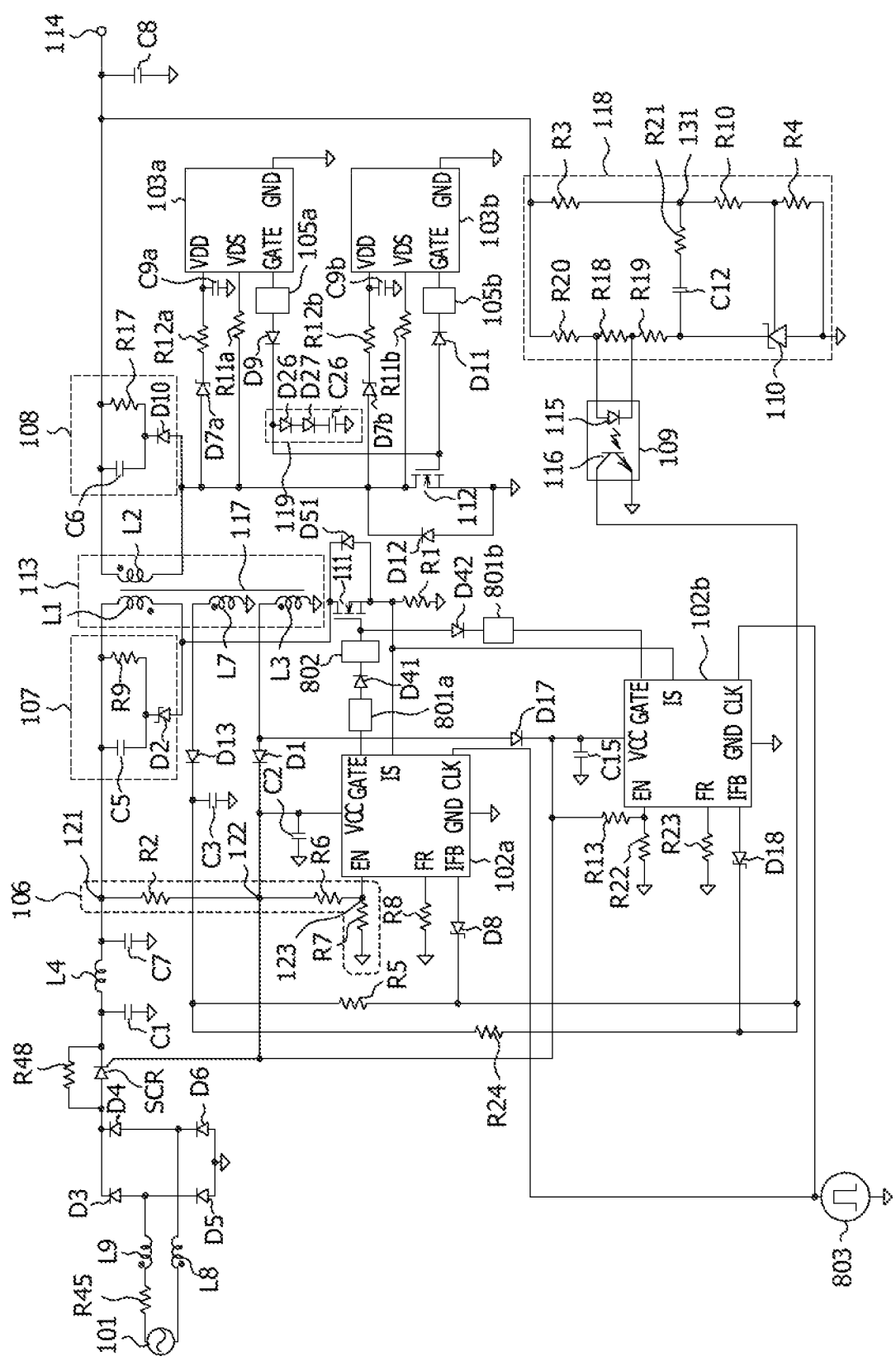
FIG. 8 is a diagram illustrating an example of a configuration of a power supply circuit according to a second embodiment.

FIG. 8 is a diagram illustrating an example of a configuration of a power supply circuit according to a second embodiment. The power supply circuit illustrated in FIG. 8 is obtained by adding a primary control IC 102b, waveform shaping circuits 801a and 801b, a protecting circuit 802, and an external clock generating circuit 803 to the power supply circuit illustrated in FIG. 1. Features of the second embodiment that are different from those of the first embodiment are described below. The external clock generating circuit 803 generates a clock signal and supplies the clock signal to clock terminals CLK of the primary control ICs 102a and 102b.

The output terminal GATE of the primary control IC 102a outputs a pulse voltage to the gate of the transistor 111 via the waveform shaping circuit 801a, a diode D41, and the protecting circuit 802. The waveform shaping circuit 801a has the same configuration as the waveform shaping circuit 105a and is connected between the output terminal GATE of the primary control IC 102a and an anode of the diode D41. A cathode of the diode D41 is connected to the gate of the transistor 111. The protecting circuit 802 has the same configuration as the protecting circuit 119 and is connected to the cathode of the diode D41.

A current flows from the output terminal GATE of the primary control IC 102a through the diode D41 to the gate of the transistor 111. For example, the current flows through the diode D41 upon the rising of the gate voltage of the transistor 111 and does not flow through the diode D41 upon the falling of the gate voltage of the transistor 111. As a result, the primary control IC 102a has a function of changing the gate voltage of the transistor 111 from the low level to the high level. The waveform shaping circuit 801a shapes a rising edge of the gate voltage output by the primary control IC 102a so that the rising edge of the gate voltage is steep in order to quickly turn on the transistor 111. For example, as illustrated in FIG. 4, the waveform shaping circuit 801a shapes the rising edge 401 of the gate voltage of the transistor 111 so that the rising edge 401 of the gate voltage is steep. The protecting circuit 802 suppresses the overshoot 403 of the gate voltage output by the primary control IC 102a in order to protect the transistor 111, as illustrated in FIG. 4.

Next, a circuit for the primary control IC 102b is described. The primary control IC 102b has the same configuration as the primary control IC 102a and operates in the same manner as the primary control IC 102a. An anode of a diode D17 is connected to the anode of the diode D1, while a cathode of the diode D17 is connected to the node 122. A capacitor C15 is connected between the cathode of the diode D17 and the reference potential node. A power supply terminal VCC of the primary control IC 102b is connected to the node 122 and receives a supplied power supply voltage in the same manner as the power supply terminal VCC of the primary control IC 102a.

A resistor R13 is connected between the node 122 and an enable terminal EN of the primary control IC 102b. A resistor R22 is connected between the enable terminal EN of the primary control IC 102b and the reference potential node.

A resistor R23 is connected between a frequency control terminal FR of the primary control IC 102b and the reference potential node. An oscillation frequency of an oscillating circuit 301 (refer to FIG. 3A) included in the primary control IC 102b is determined based on the resistor R23.

An anode of a Zener diode D18 is connected to a current feedback terminal IFB of the primary control IC 102b, while a cathode of the Zener diode D18 is connected to the collector of the phototransistor 116. A resistor R24 is connected between the cathode of the diode D13 and the cathode of the Zener diode D18. A ground terminal of the primary control IC 102b is connected to the reference potential terminal. A current detection terminal IS of the primary control IC 102b is connected to the source of the transistor 111.

An output terminal GATE of the primary control IC 102b outputs a pulse voltage to the gate of the transistor 111 via the waveform shaping circuit 801b and a diode D42. The waveform shaping circuit 801b has the same configuration as the waveform shaping circuit 105b and is connected between the output terminal GATE of the primary control IC 102b and a cathode of the diode D42. An anode of the diode D42 is connected to the gate of the transistor 111.

A current flows from the gate of the transistor 111 through the diode D42 to the output terminal GATE of the primary control IC 102b. For example, the current does not flow through the diode D42 upon the rising of the gate voltage of the transistor 111 and flows through the diode D42 upon the falling of the gate voltage of the transistor 111. As a result, the primary control IC 102b has a function of changing the gate voltage of the transistor 111 from the high level to the low level. The waveform shaping circuit 801b shapes a falling edge of the gate voltage output by the primary control IC 102b so that the falling edge of the gate voltage is steep in order to quickly turn off the transistor 111. For example, as illustrated in FIG. 4, the waveform shaping circuit 801b shapes the falling edge 402 of the gate voltage of the transistor 111 so that the falling edge 402 of the gate voltage is steep.

The protecting circuit 802 for suppressing the overshoot 403 upon the rising of the gate voltage of the transistor 111 is mounted for the primary control IC 102a. A protecting circuit for suppressing the undershoot 404 upon the falling of the gate voltage of the transistor 111 is not mounted for the primary control IC 102b. As a result, the overshoot 403 of the gate voltage of the transistor 111 is suppressed, while the undershoot 404 of the gate voltage of the transistor 111 is not suppressed. It is preferable that the protecting circuit 802 suppress the overshoot 403 to protect the transistor 111. When the transistor 111 is an HEMT, a threshold voltage of the transistor 111 is low and it is preferable that the undershoot 404 not be suppressed to reliably turn off the transistor 111.

The waveform shaping circuit 801a for shaping the rising edge 401 of the gate voltage of the transistor 111 is mounted for the primary control IC 102a. The waveform shaping circuit 801b for shaping the falling edge 402 of the gate voltage of the transistor 111 is mounted for the primary control IC 102b. Since the shape of the rising edge 401 is different from the shape of the falling edge 402, circuit constants of the waveform shaping circuits 801a and 801b are different from each other. The waveform shaping circuit 801a conducts waveform shaping suitable for the rising edge 401. The waveform shaping circuit 801b conducts waveform shaping suitable for the falling edge 402.

The primary control ICs 102a and 102b are connected to each other in parallel with respect to the gate of the transistor 111. The clock terminals CLK of the primary control ICs 102a and 102b are connected to the external clock generating circuit 803. The primary control ICs 102a and 102b are synchronized with a clock signal of the external clock generating circuit 803 and output the gate voltage from the output terminals GATE. Thus, the gate voltage generated by the primary control IC 102a is synchronized with the gate voltage generated by the primary control IC 102b.

According to the second embodiment, since the two primary control ICs 102a and 102b are mounted, the rising of the gate voltage of the transistor 111 and the falling of the gate voltage of the transistor 111 may be separately controlled. Since the two primary control ICs 102a and 102b are mounted, the overshoot 403 may be suppressed and the undershoot 404 may remain. The waveform shaping circuit 801a conducts the waveform shaping suitable for the rising edge 401, and the waveform shaping circuit 801b conducts the waveform shaping suitable for the falling edge 402.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A gate driving circuit comprising:
   a first transistor;
   a first control circuit that changes a gate voltage of the first transistor from a low level to a high level;
   a second control circuit that changes the gate voltage of the first transistor from the high level to the low level; and
   a protecting circuit that suppresses overshoot of the gate voltage output by the first control circuit and does not suppress undershoot of the gate voltage output by the second control circuit,
   wherein the first control circuit and the second control circuit are coupled to each other in parallel with respect to a gate of the first transistor.

2. The gate driving circuit according to claim 1, further comprising:
   a first diode that includes an anode coupled to an output terminal of the first control circuit and a cathode coupled to the gate of the first transistor; and
   a second diode that includes an anode coupled to the gate of the first transistor and a cathode coupled to an output terminal of the second control circuit.

3. The gate driving circuit according to claim 1, further comprising:
   a first shaping circuit that shapes a rising edge of the gate voltage output by the first control circuit; and
   a second shaping circuit that shapes a falling edge of the gate voltage output by the second control circuit.

4. The gate driving circuit according to claim 1, wherein the first control circuit and the second control circuit are synchronized with a drain voltage of the first transistor to generate the gate voltage.

5. The gate driving circuit according to claim 1, further comprising:
   a clock generating circuit coupled to the first control circuit and the second control circuit.

6. A power supply circuit comprising:
   a transformer including a primary winding and a secondary winding;
   a first diode coupled to the secondary winding;
   a first transistor coupled to the first diode in parallel;
   a first control circuit that changes a gate voltage of the first transistor from a low level to a high level;
   a second control circuit that changes the gate voltage of the first transistor from the high level to the low level; and
   a protecting circuit that suppresses overshoot of the gate voltage output by the first control circuit and does not suppress undershoot of the gate voltage output by the second control circuit,
   wherein the first control circuit and the second control circuit are coupled to each other in parallel with respect to a gate of the first transistor.

7. The power supply circuit according to claim 6, wherein the first control circuit and the second control circuit are synchronized with a drain voltage of the first transistor to generate the gate voltage.

8. A power supply circuit comprising:
   a transformer including a primary winding and a secondary winding;
   a first transistor coupled to the primary winding;
   a first control circuit that changes a gate voltage of the first transistor from a low level to a high level;
   a second control circuit that changes the gate voltage of the first transistor from the high level to the low level; and
   a protecting circuit that suppresses overshoot of the gate voltage output by the first control circuit and does not suppress undershoot of the gate voltage output by the second control circuit,
   wherein the first control circuit and the second control circuit are coupled to each other in parallel with respect to a gate of the first transistor.

9. The power supply circuit according to claim 8, further comprising:
   a clock generating circuit coupled to the first control circuit and the second control circuit.

* * * * *